(12) United States Patent
Yang et al.

(10) Patent No.: US 7,076,177 B1
(45) Date of Patent: Jul. 11, 2006

(54) BIT-RATE INDEPENDENT OPTICAL RECEIVER AND METHOD THEREOF

(75) Inventors: Kwang-Jin Yang, Yongin-shi (KR);
Jun-Ho Koh, Songnam-shi (KR);
Gil-Yong Park, Yongin-shi (KR);
Bong-Sin Kwark, Songnam-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 799 days.

(21) Appl. No.: 09/621,009

(22) Filed: Jul. 20, 2000

(30) Foreign Application Priority Data

Aug. 5, 1999 (KR) .............................. 1999-32170

(51) Int. Cl.
*H04B 10/00* (2006.01)
*H04B 10/06* (2006.01)
*H03K 5/01* (2006.01)

(52) U.S. Cl. ............... 398/208; 398/202; 398/155; 398/136; 398/158; 398/161; 327/165

(58) Field of Classification Search ............... 398/154, 398/155, 202–214, 136, 158, 161; 327/165
See application file for complete search history.

(56) References Cited

U.S. PATENT DOCUMENTS

| | | | |
|---|---|---|---|
| 4,361,897 A * | 11/1982 | Kloeber | .................... 375/359 |
| 4,475,212 A | 10/1984 | McLean et al. | |
| 4,524,462 A | 6/1985 | Cottatelucci | |
| 4,888,791 A | 12/1989 | Barndt, Sr. | |
| 5,144,469 A | 9/1992 | Brahms et al. | |
| 5,181,134 A | 1/1993 | Fatehi et al. | |
| 5,510,919 A | 4/1996 | Wedding | |
| 5,550,864 A | 8/1996 | Toy et al. | |

(Continued)

FOREIGN PATENT DOCUMENTS

EP 0342010 A2 10/1989

(Continued)

OTHER PUBLICATIONS

"Bit-rate transparent electronic data regeneration in repeaters for high speed lightwave communication systems", Mokhtari, M; Ladjemi, A; Westergren, U; Thylen, L; Proceedings of the '99 IEEE Int. Symp. on Circuits, vol. 2, May 30-Jun. 2, 1999, p. 580-511.*

(Continued)

*Primary Examiner*—Jason Chan
*Assistant Examiner*—Nathan Curs
(74) *Attorney, Agent, or Firm*—Robert E. Bushnell, Esq.

(57) ABSTRACT

A bit-rate independent optical receiver and a method thereof. In the bit-rate independent optical receiver, an optoelectric converter converts an input optical signal to an original electrical signal, a bit rate identifying unit forms a resultant signal by performing an exclusive-OR (XOR) logic operation on the original electrical signal received from the optoelectric converter and a second signal corresponding to the original electrical signal delayed by a predetermined quantity of time, and detects a bit rate from the resultant signal, a reference clock generator generates a reference clock signal according to the detected bit rate, and a clock and data recovery circuit recovers a clock signal and data from the input signal according to the reference clock signal.

29 Claims, 6 Drawing Sheets

U.S. PATENT DOCUMENTS

| | | | | |
|---|---|---|---|---|
| 5,557,648 | A | * 9/1996 | Ishihara | 375/376 |
| 5,774,002 | A | 6/1998 | Guo et al. | 327/165 |
| 6,034,801 | A | 3/2000 | Pfeiffer | |
| 6,069,722 | A | 5/2000 | Schlag | |
| 6,285,722 | B1 | * 9/2001 | Banwell et al. | 375/354 |

FOREIGN PATENT DOCUMENTS

| | | | |
|---|---|---|---|
| EP | 0342010 | A3 | 10/1989 |
| EP | 0342010 | A2 * | 11/1989 |
| GB | 2 176 376 | A | 12/1986 |
| JP | 09-018461 | | 1/1997 |
| JP | 10-224335 | | 8/1998 |
| JP | 10313277 | | 11/1998 |

OTHER PUBLICATIONS

U.S. Appl. No. 09/484,061, Kwang-Jin Yang et al., entitled *Method and Apparatus for Identifying Bit Rate* (as amended), filed on Jan. 18, 2000.

"*Notification of the Reasons for Objection*" issued by Japanese Patent Office dated on Nov. 14, 2002.

United Kingdom Patent Office Search Report dated Jan. 24, 2001.

*Office action issued on Jun. 17, 2005 by the German Patent Office in the German patent application No. 102 31 943.2-31 corresponding to U.S. Appl. No. 09/621,009.*

* cited by examiner

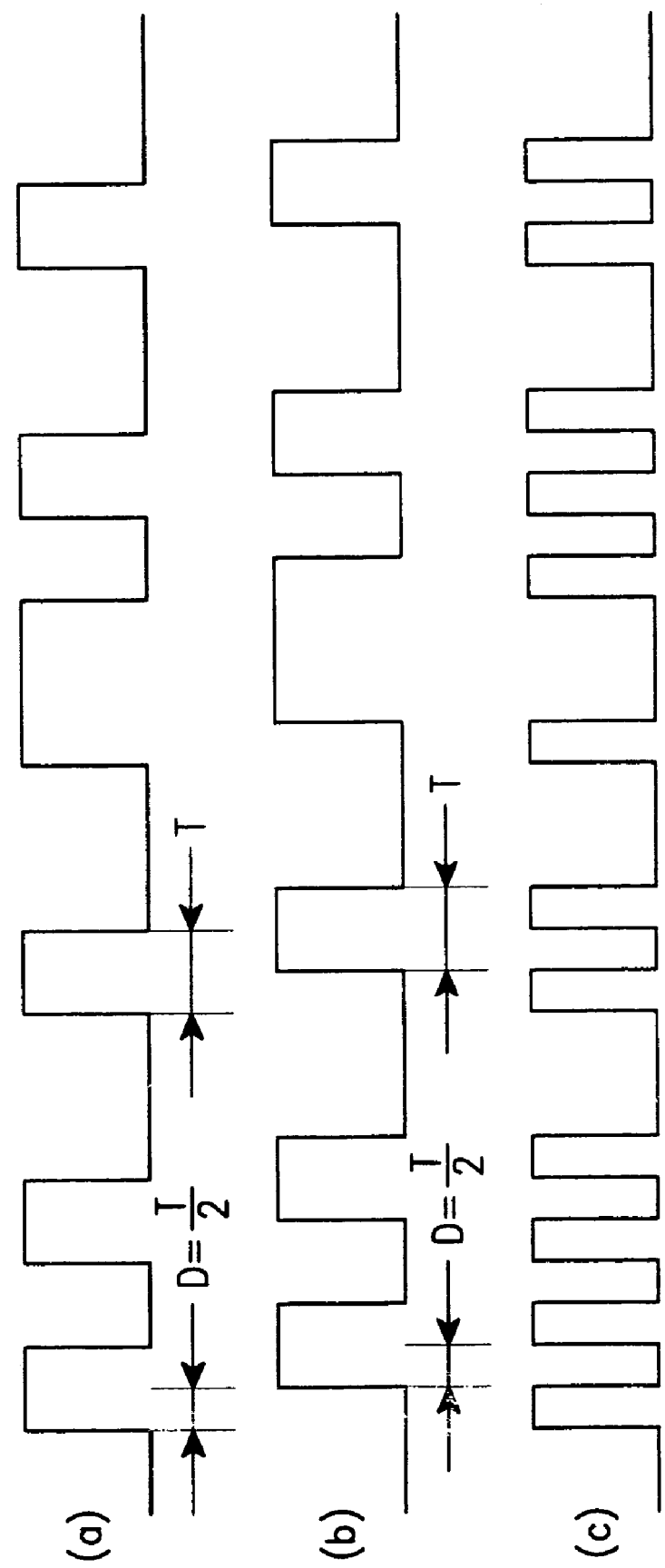

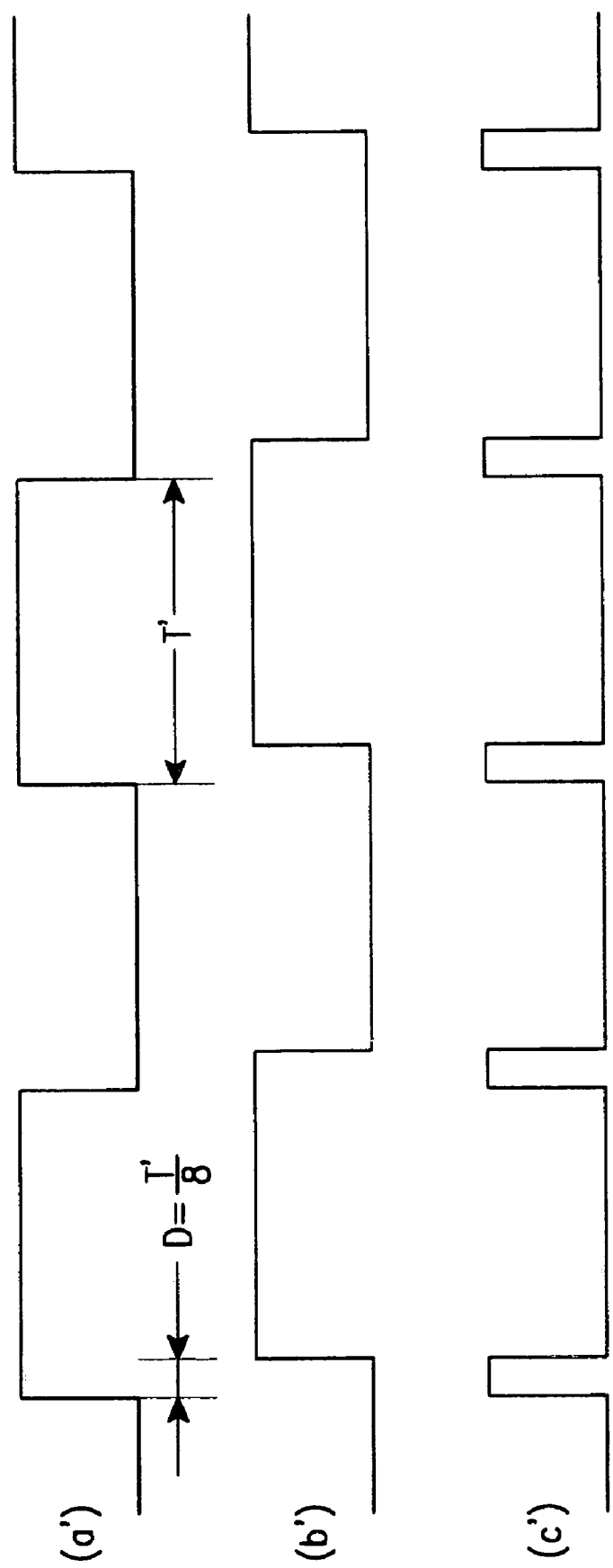

BIT-RATE INDEPENDENT OPTICAL RECEIVER AND METHOD THEREOF

CLAIM OF PRIORITY

This application makes reference to, incorporates the same herein, and claims all benefits accruing under 35 U.S.C. § 119 from an application for AN OPTICAL RECEIVERS WITH BIT-RATE INDEPENDENT CLOCK AND DATA RECOVERY AND METHOD THEREFOR earlier filed in the Korean Industrial Property Office on the $5^{th}$ of Aug. 1999 and there duly assigned Serial No. 32170/1999.

BACKGROUND OF THE INVENTION

1. Technical Field

The present invention relates generally to an optical receiver for converting an input optical signal to an electrical signal for data recovery and a method thereof in an optical transmission system.

2. Related Art

A variety of protocols are available to an optical transmission system, such as protocols for fiber distributed data interface (FDDI), enterprise systems connectivity (ESCON), fiber channel, gigabit Ethernet, and asynchronous transfer mode (ATM). Various bit rates are used for the protocols, including 125 megabits per second (Mbps), 155 Mbps, 200 Mbps, 622 Mbps, 1062 Mbps, 1.25 gigabits per second (Gbps), and 2.5 Gbps.

Among the protocols and bit rates, an optical transmission system selects an appropriate protocol/bit rate. Since the bit rate of an optical signal is preset in the optical transmission system, an optical receiver in a relay or a terminal operates at the bit rate according to the selected protocol. The bit rate corresponds to a transmission rate. The bit rate can be expressed as a transmission rate of a number of bits per second (bps).

I have found that it would be desirable to improve optical receiver technology. Efforts have been made to improve optics-related technologies.

Exemplars of recent efforts in the art include U.S. Ser. No. 09/484,061 for METHOD AND APPARATUS FOR IDENTIFYING BIT RATE applied for by Yang, U.S. Pat. No. 5,181,134 for A Photonic Cross-Connect Switch issued to Fatehi et al., U.S. Pat. No. 4,888,791 for A Clock Decoder and Data Bit Transition Detector for Fiber Optic Work Station issued to Barndt, Sr., U.S. Pat. No. 5,510,919 for An Optical System for Transmitting a Multilevel Signal issued to Wedding, U.S. Pat. No. 5,144,469 for A Method for the Transmission of Data Between Two Stations by Means of Optical Waveguides issued to Brahms et al., U.S. Pat. No. 5,550,864 for A Bit Rate-Insensitive Mechanism for Transmitting Integrated Clock and Data Signals over Digital Communication Link issued to Toy et al., U.S. Pat. No. 4,524,462 for A System for Jointly Transmitting High-Frequency and Low-Frequency Digital Signals over a Fiber-Optical Carrier issued to Cottatelucci, U.S. Pat. No. 6,069,722 for A Transmitter for Optically Transmitting Analog Electric Signals, and Digital Transmission System issued to Schlag, U.S. Pat. No. 6,034,801 for A Transmitting Device, Transmitting Apparatus and Optical Transmission System for Optically Transmitting Analog Electrical Signals issued to Pfeiffer, and U.S. Pat. No. 4,475,212 for A Frequency-Independent, Self-Clocking Encoding Technique and Apparatus for Digital Communications issued to McLean et al.

While these recent efforts provide advantages, I note that they fail to adequately provide an improved bit-rate independent optical receiver and method thereof having enhanced efficiency.

SUMMARY OF THE INVENTION

It is, therefore, an object of the present invention to provide a bit-rate independent optical receiver for accommrodating optical signals at different bit rates and a method thereof.

It is another object of the present invention to provide a bit-rate independent optical receiver for recovering data and clock signals from optical signals received at different bit rates, and a method thereof.

It is a further object of the present invention to provide a bit-rate independent optical receiver and a method thereof, which can increase transmission quality and transmission distance.

These and other objects can be achieved by providing a bit-rate independent optical receiver. In the bit-rate independent optical receiver, an optoelectric converter converts an input optical signal to an original electrical signal, a bit rate identifying unit performs an exclusive-OR (XOR) logic operation upon the original electrical signal received from the optoelectric converter and a second signal corresponding to the original electrical signal delayed by a predetermined time, and detects a bit rate from the resultant signal resulting from the exclusive-OR logic operation, a reference clock generator generates a reference clock signal according to the detected bit rate, and a clock and data recovery circuit recovers a clock signal and data from the input signal according to the reference clock signal.

To achieve these and other objects in accordance with the principles of the present invention, as embodied and broadly described, the present invention provides a bit-rate independent optical receiver comprising: an optoelectric converter for converting an input optical signal to an electrical signal; a bit rate identifying unit having an identification signal generator for delaying the input signal, comparing the delayed signal with the original input signal period by period, and generating a sensing signal, and a bit rate deriving unit for low-pass-filtering the sensing signal and determining the bit rate from the resulting voltage level; a reference clock generator having a plurality of oscillators for generating clock signals of different frequencies, for selectively operating the oscillators to generate the reference clock signal the same as the bit rate detected by the bit rate identifying unit; and a clock and data recovery circuit for recovering a clock signal and data from the input signal according to the reference clock signal.

To achieve these and other objects in accordance with the principles of the present invention, as embodied and broadly described, the present invention provides an apparatus, comprising: a converter converting an input optical signal to an original electrical signal; an identification unit receiving said original electrical signal, generating a first signal corresponding to said original electrical signal delayed by a predetermined quantity of time, generating a second signal corresponding to said original electrical signal not delayed, comparing said first and second signals, forming a third signal in dependence upon said comparing of said first and second signals, and detecting a bit rate in dependence upon said third signal; a clock generator generating a reference clock signal in dependence upon said detected bit rate; and a recovery unit recovering an input clock signal and data from said input optical signal in dependence upon said reference clock signal.

To achieve these and other objects in accordance with the principles of the present invention, as embodied and broadly described, the present invention provides a method of operating a receiver which functions independently of a bit rate of a received signal, comprising: receiving an original signal; generating a resultant signal by comparing a first signal and a second signal, said first signal corresponding to said original signal delayed by a predetermined quantity of time, said second signal corresponding to said original signal not delayed; determining a bit rate of said original signal in dependence upon said resultant signal; generating a reference clock signal in dependence upon said determined bit rate; and recovering an input clock signal and data from said original signal in dependence upon said reference clock signal.

To achieve these and other objects in accordance with the principles of the present invention, as embodied and broadly described, the present invention provides an apparatus, comprising: a converter converting an input optical signal to an original electrical signal; an identification unit receiving said original electrical signal, generating a first signal corresponding to said original electrical signal delayed by a pretermined quantity of time, generating a second signal corresponding to said original electrical signal not delayed, forming a third signal by performing an exclusive-OR logic operation upon said first and second signals, and detecting a bit rate in dependence upon said third signal; a clock generator generating a reference clock signal in dependence upon said detected bit rate; and a recovery unit recovering an input clock signal and data from said input optical signal in dependence upon said reference clock signal.

The present invention is more specifically described in the following paragraphs by reference to the drawings attached only by way of example. Other advantages and features will become apparent from the following description and from the claims.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to exemplify the principles of this invention.

FIGS. 4A and 4B are exemplary waveforms output from function blocks, for describing the operation of the bit rate identifying unit shown in FIG. 3, in accordance with the principles of the present invention.

DETAILED DESCRIPTION OF THE PREFERRED EMBODIMENT

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
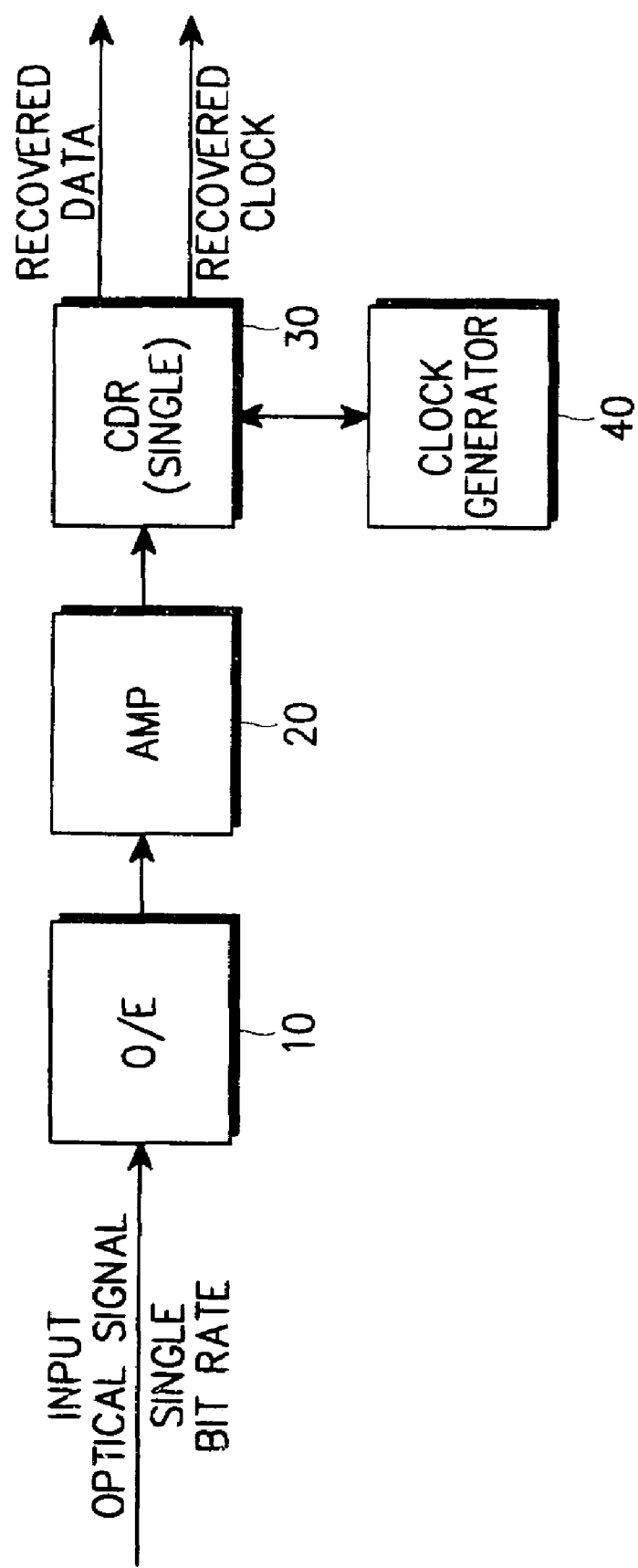
FIG. 1 is a schematic block diagram of an optical receiver.

FIG. 1 is a schematic block diagram of an optical receiver. Referring to FIG. 1, the optical receiver is comprised of an optoelectric (O/E) converter 10, an amplifier (AMP) 20 for amplifying an electrical signal outputted from the optoelectric converter 10, a clock generator 40 for generating a reference clock signal according to the bit rate of an input optical signal, and a clock and data recovery (CDR) circuit 30 for recovering a clock signal and data from an amplified signal received from the amplifier 20.

An optical signal is input to the optoelectric converter 10 at a bit rate preset according to a single protocol used in a corresponding optical transmission system. Therefore, the optical receiver receives an optical signal at the single bit rate. The clock and data recovery circuit 30 receives a clock signal of a predetermined single frequency according to the bit rate from the clock generator 40 and recovers data and a clock signal from the input signal based on the single reference clock signal by reshaping, regeneration, and retiming.

Optical communication systems are being developed from a time division multiplexing (TDM) to a wavelength division multiplexing (WDM). The wavelength division multiplexing scheme multiplexes a plurality of channels at different wavelengths and propagates the multiplexed optical signals onto a single optical fiber. Accordingly, research has been conducted on a multiplexing of optical signals in different channels with different protocols and bit rates into one strand of optical fiber. Due to an increasing demand for optical transmission systems and the increase of data traffic especially in metropolitan areas, a wavelength division multiplexing system for use in metropolitan areas should be flexible enough to accommodate various formats for fiber distributed data interface (FDDI), enterprise systems connectivity (ESCON), fiber channel, gigabit Ethernet, and asynchronous transfer mode (ATM), which mainly deal with data traffic, as well as those for synchronous digital hierarchy/synchronous optical network (SDH/SONET) evolved from voice transmission.

In this context, a so-called protocol free system has been developed to accommodate optical signals at different bit rates. Therefore, optical signals are recovered just by waveform shaping, that is, reshaping and regeneration, without recovering a clock signal. The resulting noise and timing jitters, which increases as an optical signal passes through nodes, decreases transmission quality. In particular, a receiver or transponder confined to the reshaping and regeneration function is limited in transmission distance due to the decreased transmission quality when various protocols/bit rates are used in an optical network.

A preferred embodiment of the present invention will be described hereinbelow with reference to the accompanying drawings. In the following description, well-known functions or constructions are not described in detail since they would obscure the invention in unnecessary detail.

An optical receiver according to the present invention receives optical signals at different bit rates from remote optical transmission systems and detects the bit rates of the received optical signals. It also recovers the received signals through retiming using clock signals having the same bit rate with the input data extracted from the received optical signals.

Figure 2:
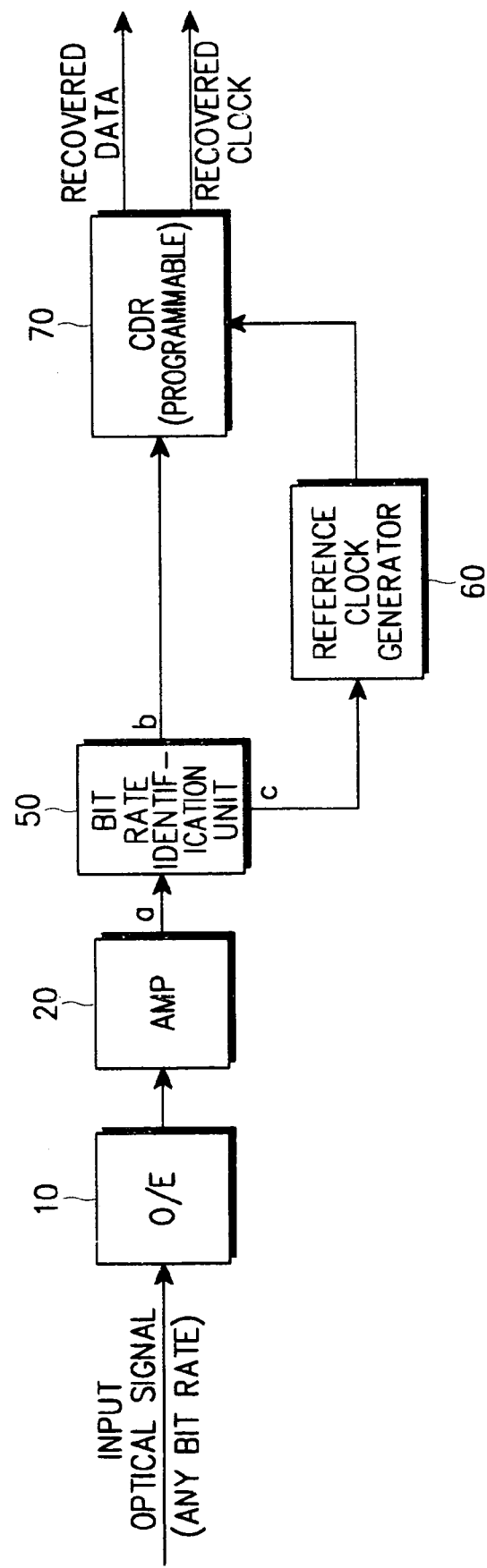
FIG. 2 is a block diagram of an optical receiver according to an embodiment of the present invention, in accordance with the principles of the present invention.

FIG. 2 is a block diagram of an optical receiver according to an embodiment of the present invention. The optical receiver is a protocol-free one independent of a bit rate and can operate with an optical signal received at any bit rate. The optical receiver operates independently of the input signal's bit rate. The optical receiver is insensitive to bit rate. The optical receiver is transparent to signal bit rate.

Referring to FIG. 2, the optical receiver includes the optoelectric converter 10 for converting an optical signal received at any bit rate to an electrical signal, the amplifier 20 for amplifying the electrical signal outputted from the optoelectric converter 10, a bit rate identifying unit 50 for identifying a bit rate from the received signal, a reference clock generator 60 for generating a reference clock signal according to the identified bit rate, and a clock and data recovery circuit 70 for recovering a clock signal and data from the amplified signal received from the amplifier 20 by means of the reference clock signal generated from the reference clock generator 60.

Since the optical signal inputted to the optoelectric converter 10 is very weak, because the signal reaches the corresponding receiver after being transmitted a long distance, the amplifier 20 is included to amplify this input signal to an appropriate level.

An optical signal is applied at a certain bit rate in a certain protocol to the input of the optoelectric converter 10. The input optical signal is converted to an electrical signal by the optoelectric converter 10 and its bit rate is identified by the bit rate identifying unit 50. The reference clock generator 60 includes a plurality of oscillators for generating clock signals with different frequencies, which is different from the clock generator 40 shown in FIG. 1. The clock generator 40 in FIG. 1 only generates a single type of clock signal, in accordance with the single bit rate of the input optical signal, as shown in FIG. 1. However, the reference clock generator 60 selectively operates the internal oscillators to generate a reference clock signal at a detected bit rate. The clock and data recovery circuit 70 is a programmable circuit, which is different from the clock and data recovery circuit 30 shown in FIG. 1, for reshaping, regeneration, and retiming of an input signal according to the reference clock signal received from the reference clock generator 60.

For reference, XOR-gating two particular signals is the equivalent of performing an exclusive-OR logic operation upon those two particular signals. The bit rate identifying unit 50 identifies the bit rate of an input signal from a signal delayed from the input signal by a predetermined time and a voltage level produced by XOR-gating the input signal with the delayed signal and then low-pass-filtering the XOR-gated signal. A bit rate identifying unit has been described in U.S. Ser. No. 09/484,061 entitled "Method and apparatus for identification of bit rate," here incorporated by reference. The structure and operation of the bit rate identifying unit 50 will be described in detail referring to the attached drawings.

Figure 3:
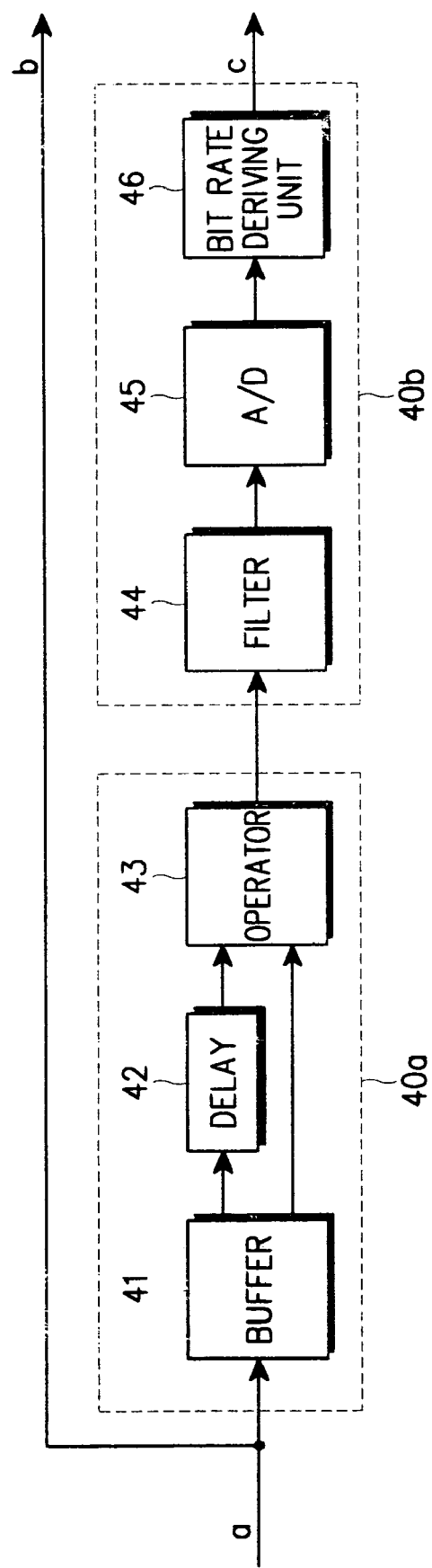
FIG. 3 is a block diagram of a bit rate identifying unit shown in FIG. 2, in accordance with the principles of the present invention.

FIG. 3 is a block diagram of the bit rate identifying unit shown in FIG. 2 and FIGS. 4A and 4B shows signals outputted from function blocks, for describing the operation of the bit rate identifying unit shown in FIG. 3. Referring to FIGS. 3, 4A, and 4B, the bit rate identifying unit 50 includes an identification signal generator 40a for delaying an input signal by a long time period, comparing the original signal with the delayed signal period by period, and generating a sensing signal, and a bit rate deriving unit 40b for determining a bit rate of the received signal from a voltage level obtained by low-pass-filtering the identification signal.

The identification signal generator 40a includes a buffer 41 for duplicating an input signal into two signals equal to the input signal, a delay 42 for delaying one of the buffer outputs by a predetermined time, and an operator 43 for performing the exclusive-OR (XOR) operation upon the delayed signal and the original input signal, and generating a bit rate identification signal.

With reference to FIG. 4A, in the thus-constituted bit rate identification signal generator 40a, the delay 42 generates a signal (b) delayed from an input signal (a) by a predetermined time D, for the input of the signal (a) with pulse period 2T. Here, D is T/2 for example. The operator 43 generates a sensing signal (c) by XOR-gating the input signal (a) with the delayed signal (b). The sensing signal (c) has a plurality of pulses with high level periods presented at the same intervals as D. For example, at a first moment in time, if original input signal (a) corresponds to a 0 and delayed signal (b) also corresponds to a 0, then the resulting sensing signal (c) will be a 0 due to the logical exclusive-OR gate operation performed upon signals (a) and (b). At a second moment in time, if signal (a) is a 0 and signal (b) is a 1, then the signal (c) will be a 1 due to the logical exclusive-OR gate operation. At a third moment in time, if signal (a) is a 1 and signal (b) is a 0, then signal (c) will be a 1. At a fourth moment in time, if signal (a) is a 1 and signal (b) is also a 1, then signal (c) will be a 0.

Meanwhile, FIG. 4B illustrates an input signal (a') at a different bit rate from that of the input signal (a) shown in FIG. 4A. In FIG. 4B, the bit rate of the input signal (a') is a fourth of that of the input signal (a) shown in FIG. 4A, that is, the input signal (a') has pulse period T' four times greater than T. The delay 42 generates a signal (b') delayed from the input signal (a') by D=T/2, namely, T'/8. The operator 43 EXOR-gates the input signal (a') with the delayed signal (b') and generates a sensing signal (c'). The sensing signal (c') has a plurality of pulses with high level periods presented at the same intervals as D.

In comparison between FIGS. 4A and 4B, when the sensing signals are generated using input signals received for the same time period, the pulses of the sensing signal (c) are a few times more than those of the sensing signal (c'). That is, the pulse numbers of the sensing signals are different due to the different bit rates of the input signals, and the difference between the pulse numbers is proportional to the difference between the bit rates.

Therefore, a bit rate can be detected by checking the number of pulses of a sensing signal generated for a predetermined time. However, such a circuit as can directly count the pulses of the sensing signal to detect the bit rate of the input signal is difficult to configure since the current optical transmission system employs a maximum bit rate in Gbps units.

To overcome this limitation, the bit rate deriving unit 40b low-pass-filters the sensing signal and detects the bit rate from the resulting voltage level. Returning to FIG. 3, the bit rate deriving unit 40b includes a filter 44 for low-pass filtering a sensing signal received from the operator 43 of the identification signal generator 40a, an analog-to-digital converter (ADC) 45 for converting an analog signal received from the filter 44 to a digital signal, and a bit rate deriving unit 46 for determining the bit rate from the output of the analog-to-digital converter 45.

The filter 44 shown in FIG. 3 is a low pass filter. The filter 44 receives a high frequency digital signal and outputs direct voltage components having levels according to the pulses of the inputted digital signal. That is, the signal outputted from the filter 44 can be regarded as an analog signal. The analog-to-digital converter 45 converts the direct voltage components into digital values as a step prior to determining the direct voltage level of the inputted analog signal.

Figure 5:
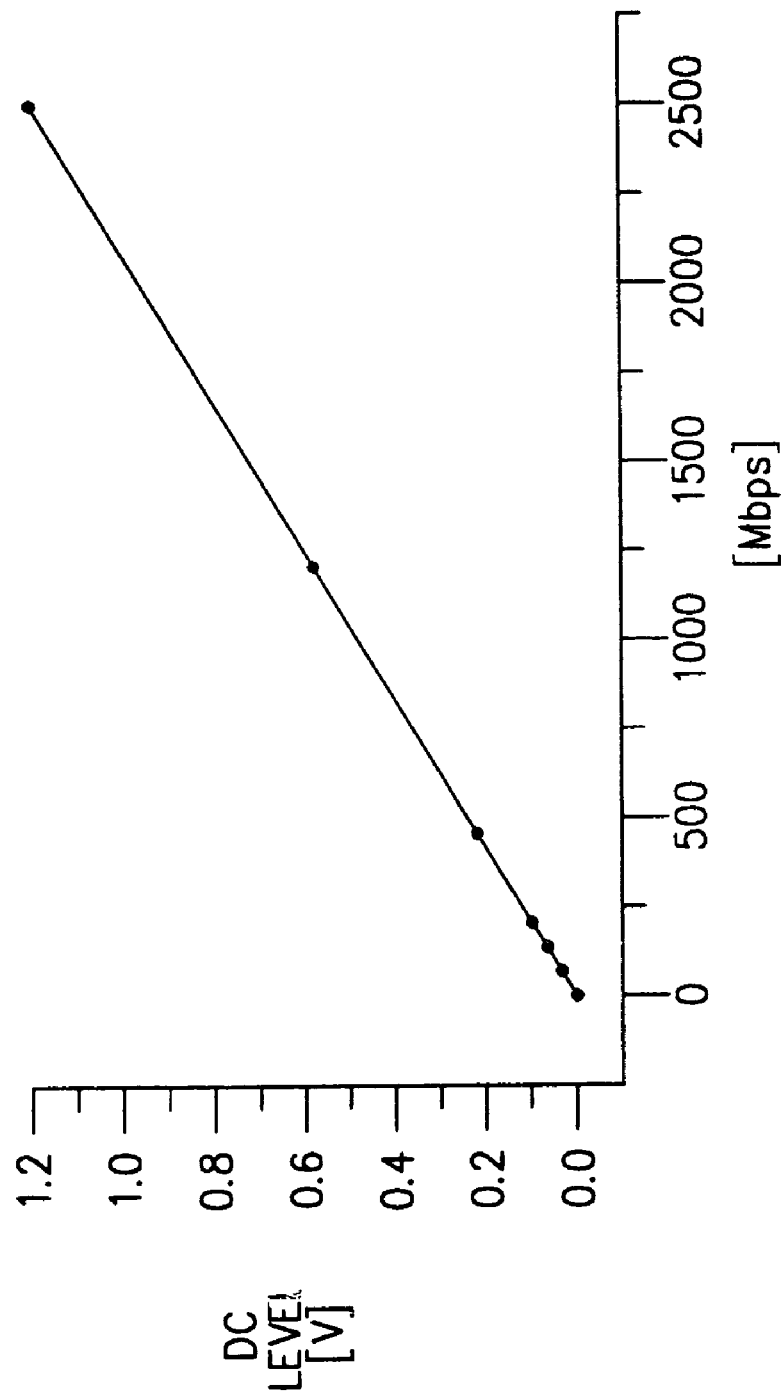
FIG. 5 is graph showing the relationship between the bit rate of an optical signal versus the output direct current (DC) level of a filter shown in FIG. 3, in accordance with the principles of the present invention.

FIG. 5 is a graph showing the relationship between an optical signal bit rate and the output level of the filter 44 shown in FIG. 3. In FIG. 5, the voltage levels of a sensing signal low-pass-filtered in the filter 44 are shown with respect to bit rates ranging from 100 Mbps to 2.5 Gbps. As shown in FIG. 5, since the voltage level increases linearly with the bit rate, the bit rate can be determined from the voltage level.

By use of the bit rate identifying unit 50, the reference clock generator 60, and the clock and data recovery circuit 70, the optical receiver of the present invention can detect a bit rate from an optical signal at the bit rate received from an optical transmission system.

As described above, the bit-rate independent optical receiver of the present invention detects a bit rate from an optical signal received at the bit rate in recovering the input signal. Therefore, it can accommodate optical signals at different bit rates and recover data and a clock signal from an input optical signal, thereby increasing transmission quality and transmission distance.

Furthermore, the optical receiver can operate adaptively with respect to a bit rate. Especially, when the optical receiver is applied to a wavelength division multiplexing transmission system together with other devices operated at different bit rates, there is no need for changing a channel card in the optical receiver even if wavelengths assigned to the devices or a system structure should be changed.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. An apparatus, comprising:
   a converter for converting an input optical signal to an original electrical signal;
   an identification unit for receiving said original electrical signal, for generating a first signal comprising said original electrical signal delayed by a predetermined quantity of time, for generating a second signal comprising said original electrical signal not delayed, for comparing said first and second signals, for forming a third signal in dependence upon said comparing of said first and second signals, and for detecting a bit rate in dependence upon said third signal;
   a clock generator for generating a separate reference clock signal in dependence upon said detected bit rate; and
   a recovery unit for recovering an input clock signal and data from said input optical signal in dependence upon said reference clock signal;
   wherein said clock generator comprises a plurality of oscillators for generating clocking signals of different frequencies, said oscillators being selectively operated to generate said reference clock signal in dependence upon said bit rate detected by said identification unit; and
   wherein said identification unit further comprises:
   a first unit for delaying said original electrical signal, for performing an exclusive-OR operation upon said first and second signals, and for forming said third signal in dependence upon said exclusive-OR operation performed upon said first and second signals; and
   a second unit for low-pass filtering said third signal, and for detecting said bit rate directly from a voltage level of said low-pass filtered third signal and without using a phase locked loop;
   said second unit comprising:
      a low-pass filter for low-pass filtering said third signal;
      an analog-to-digital converter for receiving said low-pass filtered third signal, and for converting said low-pass filtered third signal from an analog signal to a digital signal; and
      a bit rate deriving unit for deriving said bit rate directly from a voltage level of said digital signal received from said analog-to-digital converter.

2. The apparatus of claim 1, said apparatus comprising an optical receiver for receiving optical signals having a plurality of different bit rates.

3. The apparatus of claim 1, said bit rate of said input optical signal comprising a transmission rate.

4. The apparatus of claim 1, further comprising an amplifier for amplifying said original electrical signal received from said converter.

5. The apparatus of claim 4, said amplifier outputting said amplified electrical signal to said identification unit.

6. The apparatus of claim 1, said converter comprising an optoelectric converter.

7. The apparatus of claim 1, said identification unit comprising a bit rate identification unit.

8. The apparatus of claim 1, said comparing performed by said identification unit comprising said identification unit performing an exclusive-OR logic operation upon said first and second signals.

9. The apparatus of claim 1, said first unit comprising a bit rate identification signal generator.

10. The apparatus of claim 1, said second unit comprising a bit rate deriving unit.

11. The apparatus of claim 1, said first unit comprising:
    a buffer unit for receiving said original electrical signal, and for outputting two duplicate signals substantially equivalent to said original electrical signal, said two duplicate signals comprising a primary signal and a secondary signal;
    a delay unit for receiving said primary signal, for delaying said primary signal by said predetermined quantity of time, and for outputting said delayed primary signal, said delayed primary signal comprising said first signal and said secondary signal comprising said second signal; and
    an operator unit for performing said exclusive-OR logic operation upon said first and second signals.

12. The apparatus of claim 1, wherein said recovery unit comprises a programmable recovery unit.

13. A method of operating a receiver which functions independently of a bit rate of a received signal, comprising:
receiving an original signal;
generating a resultant signal by performing an exclusive-OR operation on a first signal and a second signal, said first signal comprising said original signal delayed by a predetermined quantity of time, said second signal comprising said original signal not delayed;
determining a bit rate of said original signal by low-pass filtering said resultant signal and without using a phase locked loop, and deriving said bit rate directly from a voltage level of the low-pass filtered resultant signal and without using said phase locked loop;
generating a reference clock signal separate from said original signal and in dependence upon said determined bit rate; and
recovering an input clock signal and data from said original signal in dependence upon said reference clock signal;
said generating of said reference clock signal being performed by a clock generator, said clock generator comprising a plurality of oscillators for generating clocking signals of different frequencies, and said oscillators being selectively operated to generate said reference clock signal in dependence upon said detected bit rate.

14. The method of claim 13, said original signal comprising an input optical signal, said method further comprising:
converting said input optical signal to an electrical signal;
outputting two duplicate signals substantially equivalent to said electrical signal, said two duplicate signals comprising a primary signal and a secondary signal; and
delaying said primary signal by said predetermined quantity of time, and outputting said primary signal, said delayed primary signal comprising said first signal.

15. The method of claim 13, said first and second signals comprising electrical signals.

16. The method of claim 13, said method comprising receiving signals having a plurality of different bit rates.

17. The method of claim 13, said original signal received comprising a plurality of original signals received, said recovering of said input clock signal and data from said original signal being performed for said plurality of original signals received, said plurality of original signals received having a respective plurality of different bit rates.

18. The method of claim 13, said recovering of said input clock signal and data from said original signal being performed for a plurality of original signals received, said plurality of original signals received having a respective plurality of different bit rates.

19. The method of claim 13, said method comprising receiving optical signals having a plurality of different bit rates.

20. The method of claim 13, further comprising:
receiving an input optical signal;
converting said input optical signal to an original electrical signal;
outputting two duplicate signals substantially equivalent to said original electrical signal, said two duplicate signals comprising a primary signal and a secondary signal; and
delaying said primary signal by said predetermined quantity of time, and outputting said primary signal, said delayed primary signal comprising said first signal, said outputted primary signal comprising said second signal.

21. The method of claim 13, said receiving of said original signal being performed by an optoelectric converter, said original signal being an optical signal, said optoelectric converter converting said original optical signal to an electrical signal, said method further comprising:
outputting two duplicate signals substantially equivalent to said electrical signal, said two duplicate signals comprising a primary signal and a secondary signal, said outputting of said two duplicate signals being performed by a buffer; and
delaying said primary signal by said predetermined quantity of time, and outputting said primary signal, said delayed primary signal comprising said first signal, and said outputted primary signal comprising said second signal.

22. The method of claim 13, wherein said recovery step is performed by a programmable recovery unit.

23. An apparatus, comprising:
a converter for converting an input optical signal to an original electrical signal;
an identification unit for receiving said original electrical signal, for generating a first signal comprising said original electrical signal delayed by a predetermined quantity of time, for generating a second signal comprising said original electrical signal not delayed, for forming a third signal by performing an exclusive-OR logic operation upon said first and second signals, and for detecting a bit rate in dependence upon said third signal;
a clock generator for generating a reference clock signal in dependence upon said detected bit rate; and
a recovery unit for recovering an input clock signal and data from said input optical signal in dependence upon said reference clock signal;
said identification unit comprising:
a first unit for delaying said original electrical signal, for performing said exclusive-OR operation upon said first and second signals, and for forming said third signal; and
a second unit for detecting said bit rate of said original signal by low-pass filtering said third signal, and by deriving said bit rate directly from a voltage level of said low-pass filtered third signal and without using a phase locked loop; and
said clock generator comprising a plurality of oscillators for generating clocking signals of different frequencies and for selectively operating said oscillators to generate said reference clock signal in dependence upon said bit rate detected by said identification unit.

24. The apparatus of claim 23, said input optical signal comprising a plurality of input optical signals, said recovering of said input clock signal and data from said input optical signal being performed for each of said plurality of input optical signals, said plurality of input optical signals received having a plurality of different bit rates.

25. The apparatus of claim 24, said converter comprising an optoelectric converter.

26. The apparatus of claim 25, said identification unit comprising a bit rate identification unit.

27. The apparatus of claim 23, said second unit comprising:
- a low-pass filter for low-pass filtering said third signal;
- an analog-to-digital converter for receiving said low-pass filtered third signal, and for converting said low-pass filtered third signal from an analog signal to a digital signal; and
- a determiner for determining said bit rate in dependence upon said digital signal received from said analog-to-digital converter.

28. The apparatus of claim 23, said first unit comprising:
- a buffer unit for receiving said original electrical signal, and for outputting two duplicate signals substantially equivalent to said original electrical signal, said two duplicate signals comprising a primary signal and a secondary signal;
- a delay unit for receiving said primary signal, for delaying said primary signal by said predetermined quantity of time, and for outputting said primary signal, said delayed primary signal comprising said first signal; and
- an operator unit for performing said exclusive-OR logic operation upon said first and second signals.

29. The apparatus of claim 23, wherein said recovery unit comprises a programmable recovery unit.

* * * * *